(12) United States Patent
Subramanian et al.

(10) Patent No.: US 7,662,299 B2
(45) Date of Patent: Feb. 16, 2010

(54) NANOIMPRINT LITHOGRAPHY TEMPLATE TECHNIQUES FOR USE DURING THE FABRICATION OF A SEMICONDUCTOR DEVICE AND SYSTEMS INCLUDING SAME

(75) Inventors: Krupakar M. Subramanian, Boise, ID (US); Mirzafer Abatchev, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 912 days.

(21) Appl. No.: 11/214,684

(22) Filed: Aug. 30, 2005

(65) Prior Publication Data

US 2007/0049028 A1    Mar. 1, 2007

(51) Int. Cl.
B44C 1/22 (2006.01)
B82B 3/00 (2006.01)

(52) U.S. Cl. ............... 216/11; 216/36; 216/67; 216/88; 216/95; 216/99; 977/887; 977/888

(58) Field of Classification Search ............... None
See application file for complete search history.

(56) References Cited

U.S. PATENT DOCUMENTS

| | | | | |
|---|---|---|---|---|
| 4,849,854 A | | 7/1989 | Eguchi | 361/313 |
| 6,407,443 B2* | | 6/2002 | Chen et al. | 257/616 |
| 6,743,368 B2* | | 6/2004 | Lee | 216/2 |
| 6,759,180 B2* | | 7/2004 | Lee | 430/313 |
| 6,818,959 B2 | | 11/2004 | Montelius et al. | 257/415 |
| 6,849,558 B2 | | 2/2005 | Schaper | 438/758 |
| 7,236,242 B2* | | 6/2007 | Kamins et al. | 356/301 |
| 7,256,131 B2* | | 8/2007 | LaBrake | 438/710 |
| 7,291,282 B2* | | 11/2007 | Tong | 216/40 |
| 7,368,395 B2* | | 5/2008 | Islam et al. | 438/738 |
| 7,374,968 B2* | | 5/2008 | Kornilovich et al. | 438/110 |
| 7,407,738 B2* | | 8/2008 | Kornilovich et al. | 430/322 |
| 7,432,120 B2* | | 10/2008 | Mascolo et al. | 438/42 |
| 7,462,292 B2* | | 12/2008 | Lee | 216/54 |
| 2004/0124566 A1 | | 7/2004 | Sreenivasan et al. | 264/494 |
| 2006/0186084 A1* | | 8/2006 | Wang et al. | 216/11 |

OTHER PUBLICATIONS

Hand, Aaron, "One on One: A Closer Look at Nanoimprinting". Semiconductor International, 25 (10) 40-46, Sep. 2004.*

Kwon, S. et al "Fabrication of Metallic Nanodots in Large-Area Arrays by Mold-to-Mold Cross Imprinting (MTMCI)" Nano Letters 5 (12) 2557-2562, Nov. 11, 2005.*

Aaron Hand, "One on One: A Closer Look at Nanoimprinting", Semiconductor International Sep. 1, 2004, Reed Business Information 27 (10) 40-46, Sep. 2004.

(Continued)

*Primary Examiner*—Anita K Alanko

(57) ABSTRACT

A method for forming a template useful for nanoimprint lithography comprises forming at least one pillar which provides a topographic feature extending from a template base. At least one conformal pattern layer and one conformal spacing layer, and generally a plurality of alternating pattern layers and spacing layers, are formed over the template base and pillar. A planarized filler layer is formed over the pattern and spacing layers, then the filler, the spacing layer and the pattern layer are partially removed, for example using mechanical polishing, to expose the pillar. One or more etches are performed to remove at least a portion of the pillar, the filler, and the spacing layer to result in the pattern layer protruding from the spacing layer and providing the template pattern.

6 Claims, 20 Drawing Sheets

OTHER PUBLICATIONS

Michael D. Austin, et al, "Fabrication of 5 nm Linewidth and 14 nm Pitch Features by Nanoimprint Lithography", pp. 5299-5301, vol. 84, No. 26, American Institute of Physics, Jun. 17, 2004.

Charles D. Schaper, "MxL: Pseudo-Maskless, High-Throughput Nanolithography", SPIE Emerging Lithographic Technologies, vol. 5037 (2003).

Nicholas A. Melosh et al, "Ultrahigh-Density Nanowire Lattices and Circuits", pp. 112-115, Science vol. 300 (Apr. 4, 2003).

X.D. Huang et al, "Reversal Imprinting by Transferring Polymer from Mold to Substrate", pp. 2872-2876, J. Vac Sci. Technol. B, vol. 20, No. 6, (Nov./Dec. 2002).

Michael R. Diehl et al, "Self-Assembled, Deterministic Carbon Nanotube Wiring Networks", pp. 353-356, Agnew Chem. Int. Ed. 41, No. 2, (Jan. 18, 2002).

Yu Huang et al, "Directed Assembly of One-Dimensional Nanostructures into Functional Networks", pp. 630-633, Science, vol. 291, (Jan. 26, 2001).

Stephen Y. Chou et al, "Nanoimprint Lithography", pp. 4129-4133, J. Vac Sci. Teclmol. B, vol. 14, No. 6, (Nov./Dec. 1996).

Sunghoon Kwon, et al, Fabrication of Metallic Nanodots in Large-Area Arrays by Mold-to-Mold Cross Imprinting (MTMCI), pp. 2557-2562, vol. 5, No. 12, Nano Letters (2005), Published on web Nov. 11, 2005.

* cited by examiner

NANOIMPRINT LITHOGRAPHY TEMPLATE TECHNIQUES FOR USE DURING THE FABRICATION OF A SEMICONDUCTOR DEVICE AND SYSTEMS INCLUDING SAME

FIELD OF THE INVENTION

This invention relates to the field of semiconductor manufacture and, more particularly, to a method and structure for forming a template for nanoimprint lithography used during the formation of a semiconductor device, and systems including the semiconductor device.

BACKGROUND OF THE INVENTION

During the formation of a semiconductor device such as a memory device, logic device, microprocessor, etc., several optical lithography steps are typically required. Each optical lithography step typically includes the formation of a blanket photoresist (resist) layer, exposing portions of the resist layer to light using a mask or reticle, removing the exposed resist portions (or the unexposed resist portions if negative resist is used), etching the underlying layer using the resist as a pattern, then stripping the resist. To remove the resist, a high-temperature ash step is performed, then the wafer surface is exposed one or more times to an acid, typically a mixture of hydrogen peroxide ($H_2O_2$) and sulfuric acid ($H_2SO_4$), often referred to as a "piranha" process, to remove the resist ash which comprises organic resins and metallic contaminants.

Optical lithography adds significantly to the cost of semiconductor device production. Each optical lithography step requires significant time, as the wafers must be moved from a station that deposits the resist, typically a spin-coat process, to a stepper which exposes the resist using a mask or reticle. After the exposed or unexposed resist is removed, the wafer is moved to an etcher to etch the underlying layer, then to a furnace that ashes the resist, and finally to a piranha bath to remove the ashed resist. Optical lithography also adds expense to the wafer as it requires materials including resist and acids and their eventual disposal, and also may decrease yields from misalignment of the mask.

A continual design goal during the manufacture of semiconductor devices is to produce smaller features. One limit to this goal is the deficiencies in optical lithography that restrict the minimum feature size. This minimum for feature sizes results from various optical properties of the optical lithographic process.

To overcome the deficiencies of optical lithography, research is ongoing into other patterning techniques. One such technique is nanoimprinting, which may be classified into the three categories listed below.

A first nanoimprinting technique, "hot embossing" or "thermal embossing," comprises the use of a substrate to be patterned and a liquid coating, typically a low-viscosity monomer, formed over the substrate. A template, which comprises a surface with a raised pattern on the surface, is pressed into the coating, then the coating is cured by heating. The template is removed and the coating is used as a mask to etch the substrate.

In a second nanoimprinting technique, "UV nanoimprinting," a transparent template is pressed into a UV-curable coating over the surface of the substrate to be patterned, then the coating is exposed to UV wavelength light flashed through the transparent template to cure the coating. The template is removed and the substrate is patterned using the coating as a mask. It is generally believed that UV nanoimprinting is the most likely candidate for semiconductor processing.

With a third nanoimprinting technique, "micro contact printing," the coating is applied to the pattern on a soft, flexible template, then the template is pressed onto the substrate. The coating adheres to the substrate, then the template is removed and the coating is used as a mask to etch the substrate. Because the template is flexible, it is difficult to print features that are as small as those printed with the other two techniques.

The template used for nanopatterning may be formed using any of several methods. For example, molecular beam epitaxy (MBE) may be used to create a physical template for nanowire patterning. This method enables simple physical transfer of fully formed metallic wires from a selectively etched superlattice, for example $GaAs/Al_{0.8}Ga_{0.2}As$, onto a silicon wafer. The nanowires are defined by evaporating metal directly onto the GaAs layers of the superlattice after selective removal of the AlGaAs to create voids between the GaAs layers. By depositing the metal solely on the GaAs, the wire widths are defined by the thickness of the GaAs layers, and the separation between the wires is defined by the thickness of the AlGaAs layers. Atomic-level control over the thickness and composition of each layer is achieved by synthesizing the GaAs/AlGaAs superlattice via MBE. In this manner, automatically defined templates for metal wires can be fabricated with widths of 1 nanometer (nm) or less, although wires of this dimension have not been successfully transferred thus far.

Another method for forming the nanopatterning template uses photocurable nanoimprint lithography (P-NIL). A mold is pressed into a low viscosity photocurable resist liquid to physically deform the resist shape such that it conforms to the topology of the mold. The various components in the liquid resist are crosslinked through exposure to UV light to produce a uniform, relatively rigid polymer network. The mold is then separated from the cured resist, then an anisotropic reactive ion etch (RIE) is performed to remove the residual resist in the compressed area, thereby exposing the substrate surface.

Other methods exist for creating nanowires of small dimensions (less than 20 nm), but organizing these wires into highly ordered arrays with predetermined spacing and registry has been challenging. For practical technological applications, it is necessary not only to have nanoscale wire widths but also to know the precise location and registry between wires. Otherwise, to make contact to the nanowires, the beginning and ending locations of every nanowire must be determined and the contact patterned specifically for each wire.

Various problems may be encountered during conventional template formation. For example, resolution is limited by proximity effects inherent with electron beam lithography and thus patterning sub-35 nm pitch features is difficult. The MBE technique discussed above can create a small cluster of regularly spaced wires, but reliably creating such wires over the entire surface of the substrate is not possible using present MBE techniques.

A method for forming a template for nanoimprinting which may overcome various problems previously encountered during template manufacture, and various methods of use for the template, would be desirable.

SUMMARY OF THE INVENTION

The present invention provides a method which, among other advantages, reduces problems associated with the manufacture of templates used with nanoimprinting processes. Such nanoimprinting processes may be used to fabricate semiconductor devices.

In accordance with one embodiment of the invention, a template base is provided, and at least one pillar comprising a first material is formed over the template base. A plurality of alternating first and second conformal layers of two different materials are formed over the pillar and over the template base. One of the first and second alternating layers may be formed from the same material as the pillar, or the pillar and the first and second alternating layers may all be formed from different materials that are etchable selective to the other two.

A planarized filler layer such as a spun-on glass (SOG) layer is formed over the first and second conformal layers, the pillar, and over the template base to fill in the topography. The conformal layers are then etched, for example using chemical mechanical planarization, to expose the pillar. Subsequently, the pillar and the second conformal layers are etched selective to the first conformal layer to recess the pillar and the second conformal layer within the first conformal layer. In a first embodiment, this structure is used as the completed template, with the first conformal layer providing the pattern.

In a second embodiment, subsequent to the planarization of the first and second conformal layers, the remaining pillar and first and second conformal layers are adhered to a second substrate, for example a quartz substrate, using a transparent/translucent adhesive. The original template base is ground away to expose the first and second conformal layers and the pillar. The pillar and second conformal layer are etched to recess them within the first conformal layer, then the structure is used as the nanoimprinting template, with the first conformal layer providing the pattern. Because the adhesive and quartz base are translucent, this pattern may be used for a UV nanoimprinting process.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 1:
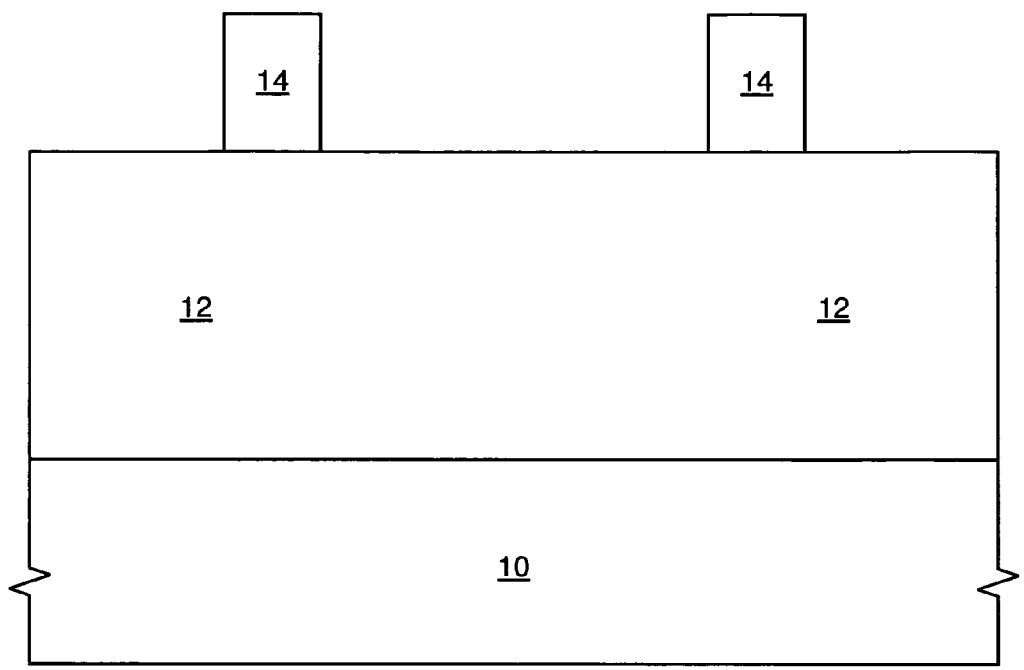
FIGS. 1-5 are cross sections depicting a first embodiment to form a nanoimprint lithography template.

A first embodiment of an inventive method for forming a template for a nanoimprinting process is depicted in FIGS. 1-5. FIG. 1 depicts a template base 10 which may comprise silicon, silicon on insulator (SOI), silicon on sapphire (SOS), doped and undoped semiconductor, gallium, gallium arsenide, etc. The base 10 may be of any reasonable thickness, as the thickness does not affect the function of the template. FIG. 1 further comprises a blanket pillar layer 12, for example an oxide such as borophosphosilicate glass (BPSG), tetraethyl orthosilicate (TEOS) or a planarized spun-on glass (SOG) oxide layer which is between about 10 Å and about 10,000 Å thick formed on a major surface of the template base. Other materials such as silicon nitride may function sufficiently. After providing the template base 10 and the pillar layer 12, a patterned photoresist layer 14 is formed over the pillar layer 12 as depicted. The pattern of the resist will determine the eventual pattern of the template, but the resulting pattern on the template will not be identical to the pattern on the resist.

Figure 2:
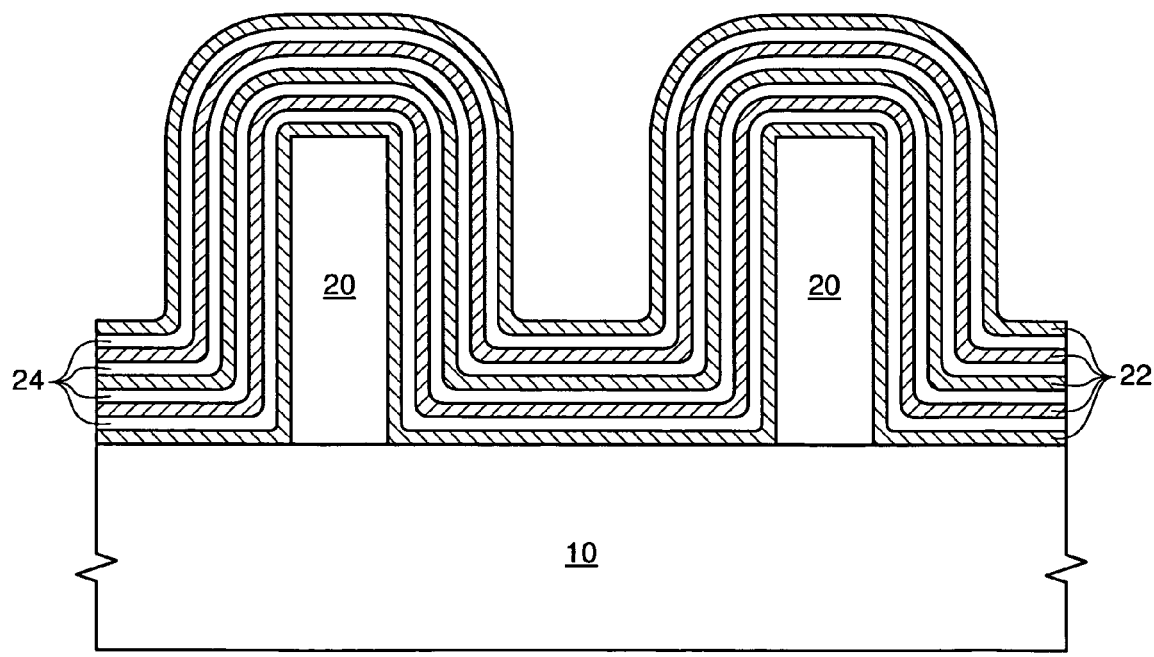

After forming the FIG. 1 structure the pillar layer 12 is etched using the resist 14 as a pattern to result in the individual cross sectional pillars 20 as depicted in FIG. 2 on the major surface of the template base. In the present embodiment, the pillars are between about 100 Å and about 1,000 Å wide, and have a pitch of between about 300 Å and about 10,000 Å (10 KÅ). It should be noted, however, that much of the dimensional information herein is exemplary only, because the pitch and layout of the pillars 20 on the template will depend on the eventual pattern to be produced. Further, the pillars are "cross sectional" because they may be elongated in a direction 90° to the cross section depicted in FIG. 2.

After etching layer 12 to form features 20, the resist 14 is removed, for example using an oxygen plasma ashing process, and alternating conformal first 22 and second 24 layers are formed over and along the pillars as depicted in FIG. 2.

The first layers 22 are pattern layers that will provide the template pattern, and the second layers 24 are spacing layers that provide spacing between the first layers 22. For this embodiment, the spacing layers 24 may comprise the same or different material as the pillars 20, but the pattern layers 22 will comprise a material different from the pillars 20 and from the spacing layers 24. For this embodiment, pillar layer 20 comprises BPSG, spacing layer 24 comprises TEOS, and pattern layer 22 comprises polysilicon. Other possible materials for the pillar layer and spacing layer include silicon nitride, and other possible materials for the pattern layer includes metal. Also with this embodiment, the pattern layers 22 and spacing layers 24 all have about the same thickness, for example between about 10 Å and about 100 Å thick; however, providing the pattern layers 22 and the spacing layers 24 with different thicknesses is equally possible, depending on the eventual use of the template. Forming pattern layers 22 with different thicknesses and/or spacing layers 24 with different thicknesses will result in a different, more irregular pattern than that used in this exemplary embodiment.

Figure 3:
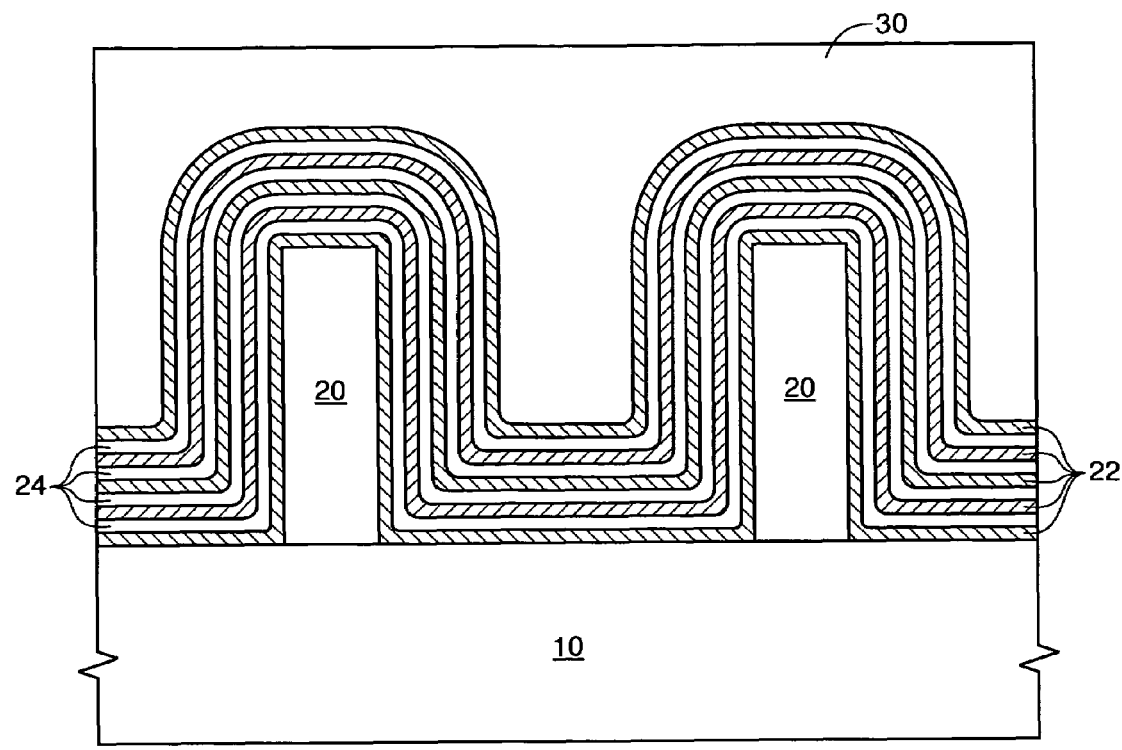

After forming the structure of FIG. 2 a filler layer 30 such as a SOG layer is formed to fill in the topography created by the pillars, the pattern layers, and the spacing layers to result in the structure of FIG. 3. The FIG. 3 structure is then planarized, for example using an abrasive planarization process such as chemical mechanical planarization, or a plasma etch, to result in the FIG. 4 structure. During this etch, the portions of layers 22 and 24 that overlie the pillars 20 are removed. This etch may comprise an over etch of the pillars 20 to ensure complete removal of layers 22, 24 from over the pillars 20.

Figure 5:
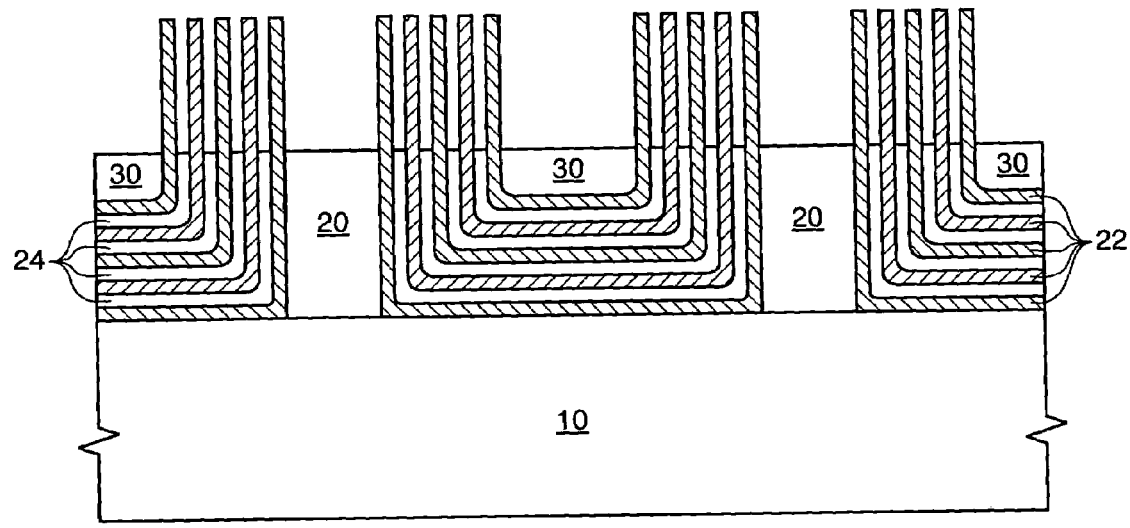

Next, the SOG layer 30, spacing layers 24, and pillars 20 are etched with a process that removes the layers at about the same rate to result in the FIG. 5 structure. The portions of pattern layer 22 that protrude from the silicon dioxide ($SiO_2$) layers 20, 24, 30 will provide the template pattern. With present technology, the width of the protruding portions of layer 22 may be as small as 50 Å, and the pitch may be as small as 10 Å.

Figure 6:
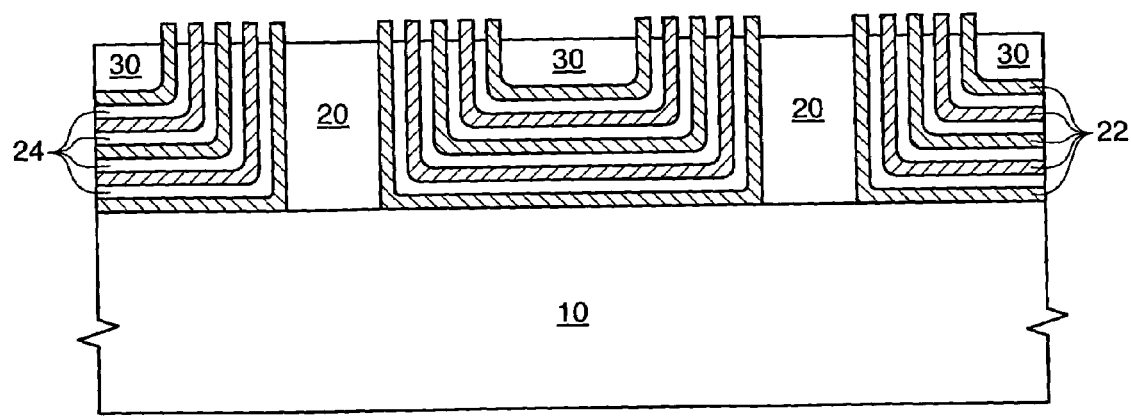
FIG. 6 is a cross section depicting a variation on the embodiment of FIGS. 1-5.

While the required minimum allowable protrusion of pattern layer 22 from the $SiO_2$ layers will depend on the thickness of the low-viscosity monomer used as a coating over the substrate to be patterned, the protrusion should be minimized to ensure structural stability of the material. The planarization of the FIG. 4 structure may continue further than that depicted for the FIG. 5 structure, for example to result in the template as depicted in FIG. 6.

Figure 7:
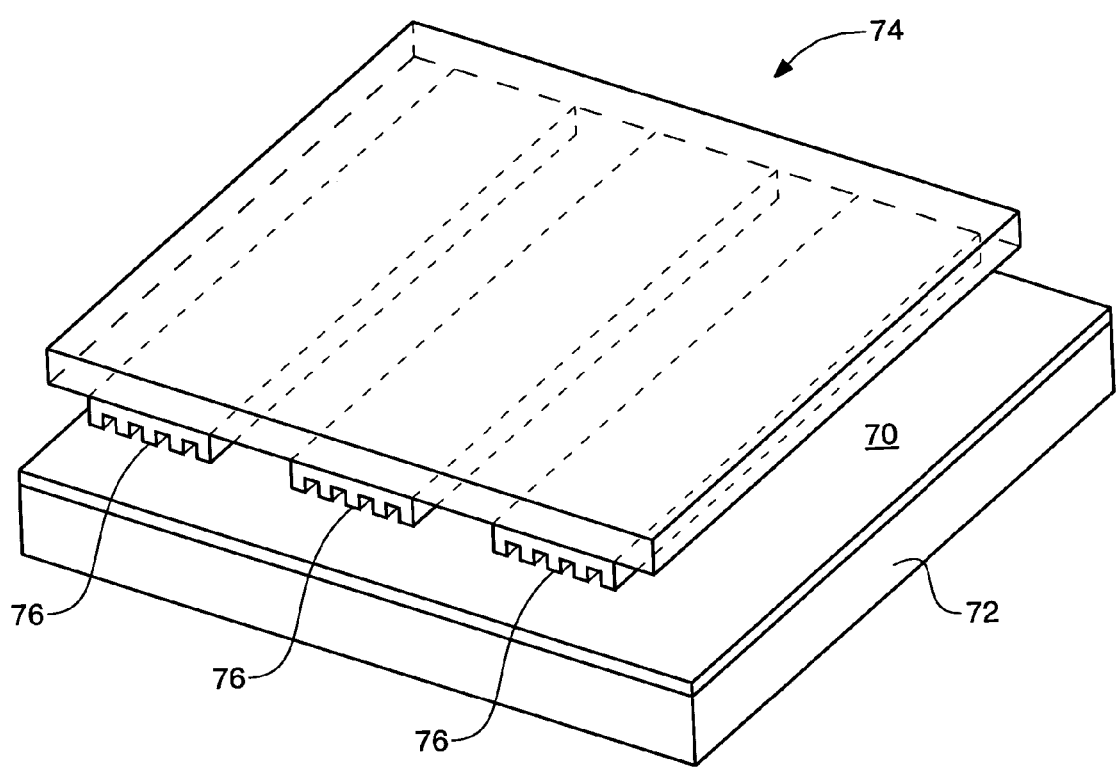
FIGS. 7-9 are isometric depictions of a method for forming a masking pattern using a nanoimprint lithography template formed in accordance with an embodiment of the present invention.
Figure 8:
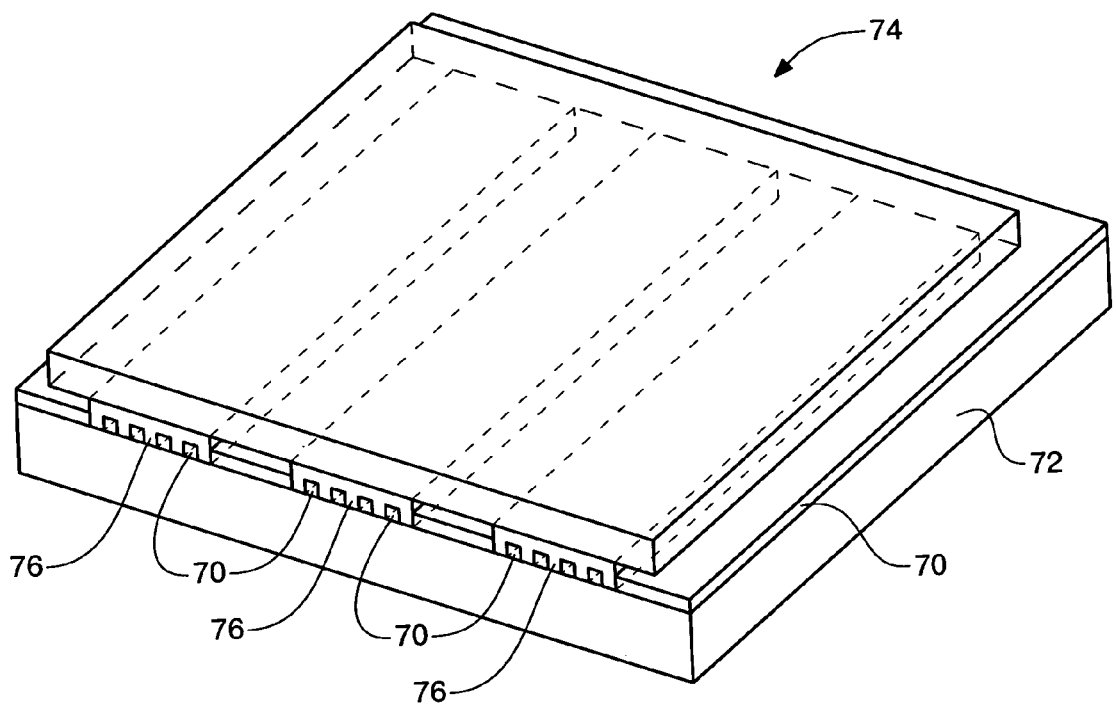
Figure 9:
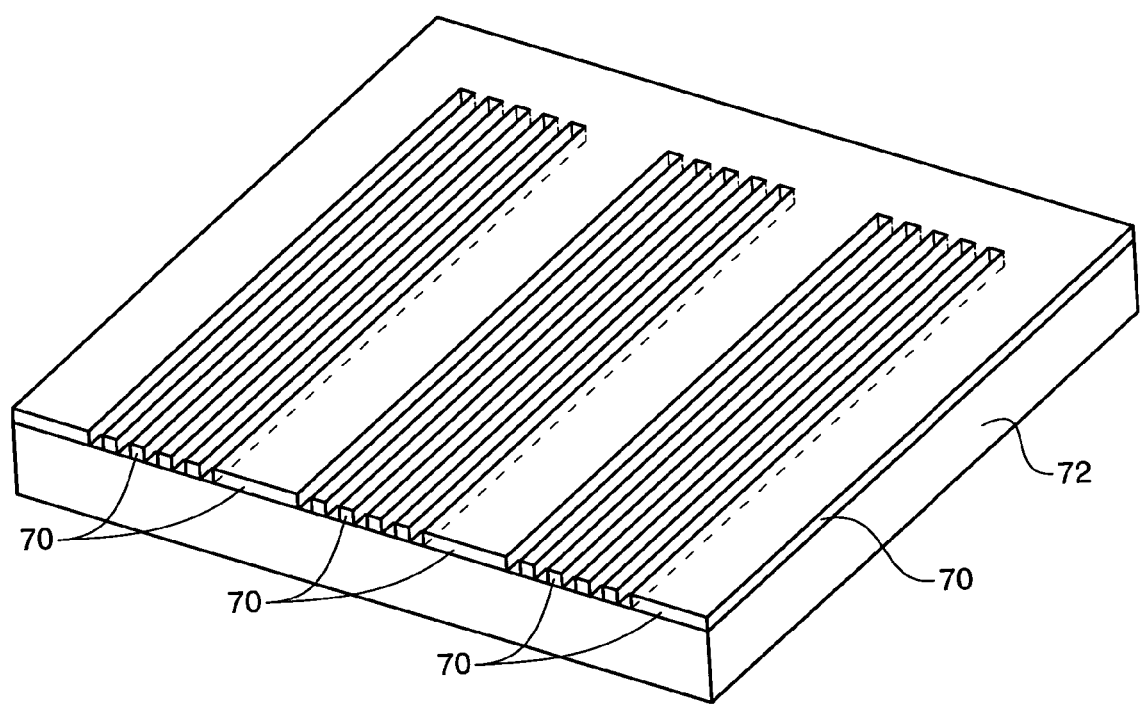

In use, a coating 70, such as a low-viscosity monomer is dispensed over a substrate 72 which is to be etched as depicted in FIG. 7. A template 74 having a pattern 76 is formed in accordance with the description herein. The pattern of the template is pressed into the coating as depicted in FIG. 8 such that the pattern contacts the substrate or is slightly spaced from it. Then the coating is cured, for example through the use of heat from a heated chuck (not depicted) on which the substrate 70 rests, through the use of UV illumination of a UV-curable adhesive, or through another process suitable for the particular coating being used, and the template is removed to result in the patterned coating as depicted in FIG. 9. Subsequently, the substrate is etched using the coating as a mask.

Figure 4:
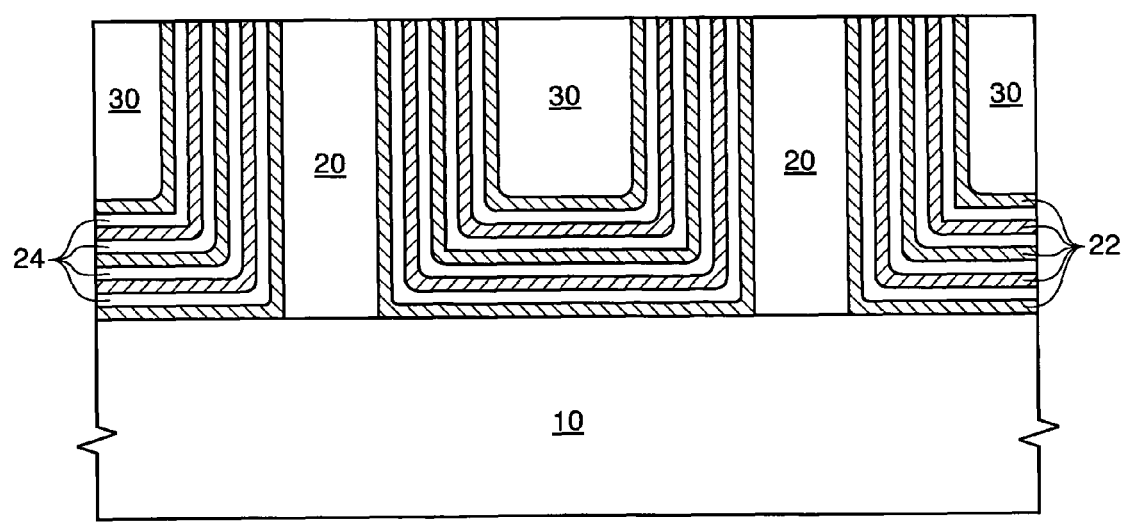
Figure 10:
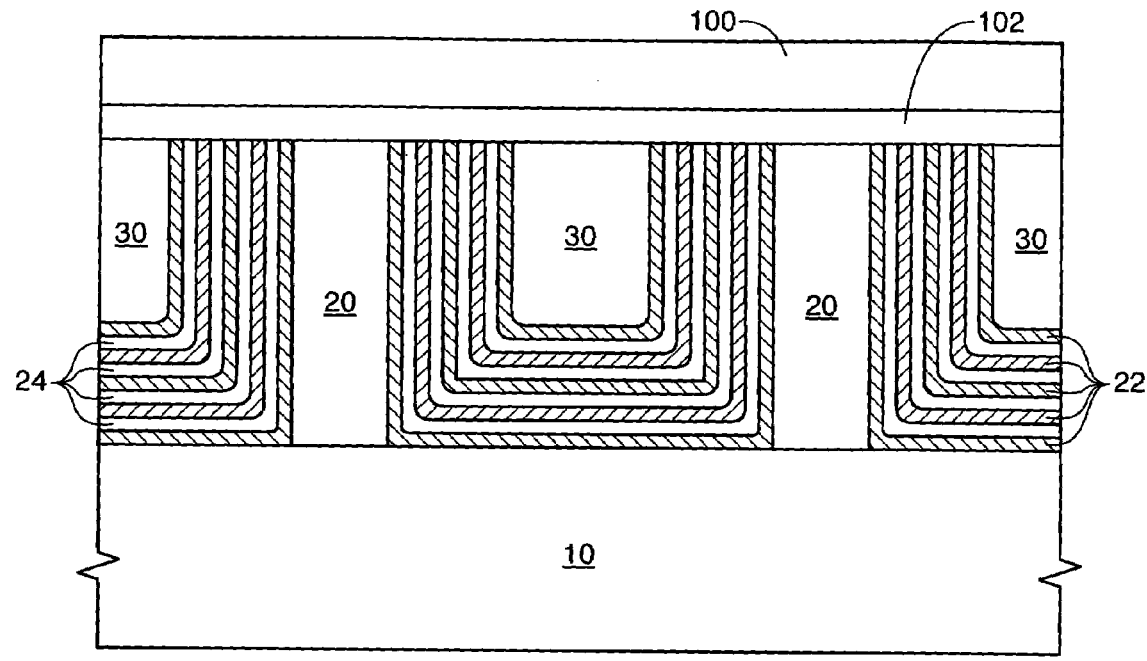
FIGS. 10 and 11 are cross sections depicting an alternate embodiment for forming a nanoimprint lithography template.
Figure 11:
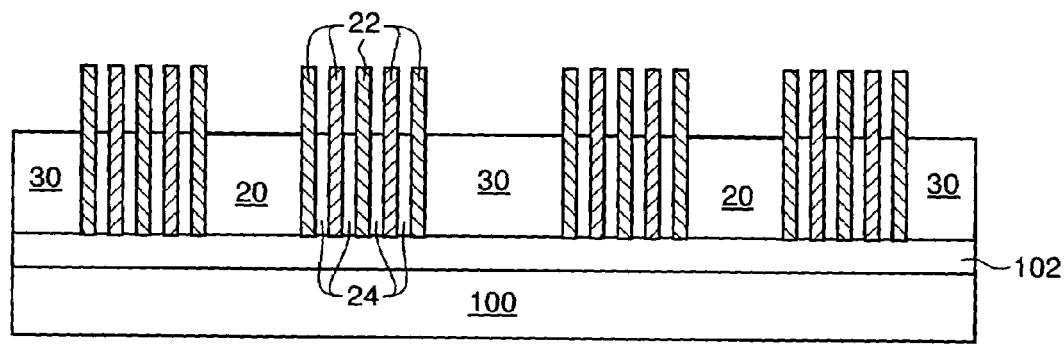

Another embodiment of the invention is depicted in FIGS. 10 and 11. In this embodiment, the structure depicted in FIG. 4 is formed in accordance with the description above. The planarized surface of the FIG. 4 structure is then adhered to another substrate 100, which will function as a template base, such as a quartz wafer using an adhesive 102 such as any suitable eutectic alloys or glass grits. For low temperature treatment, a photoresist may be used as adhesive 102. Direct bonding is also contemplated, particularly if the surfaces are compatible. Compatible surfaces will typically comprise similar materials with dangling bonds such as TEOS, which has surface properties similar to quartz and is also transparent.

After adhering the planarized surface of the FIG. 4 structure to substrate 100, the original substrate 10, which is sacrificial in this embodiment, is etched or planarized away along with the horizontal portions of conformal layers 22, 24. This leaves only the vertical portions of pattern layers 22, and of spacing layers 24. After removing the horizontal portions of these layers, the exposed SOG 30, pillars 20, and conformal spacing layers 24 are recessed to result in the FIG. 11 structure.

Figure 12:
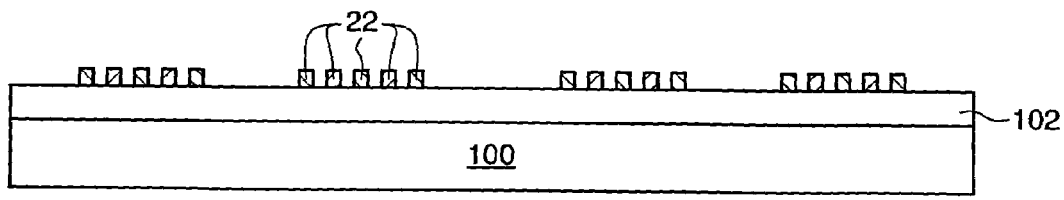
FIG. 12 is a cross section depicting a variation on the embodiment of FIGS. 10 and 11.

This embodiment has the advantage of forming the remaining "blades" of the pattern layer 22 as short as possible. For purpose of this disclosure, a "blade" is used to describe the completed pattern layer. The severity of the planarization or etch of the FIG. 10 structure will determine the length of the layer 22 features of FIG. 11. As the length of the features decreases their physical stability increases and results in decreased possibility of damage. This process, for example, may result in the structure of FIG. 12 wherein a substantial amount of pattern layer 22 of FIG. 10 has been planarized away and the SOG 30 and pillars 20 have been removed in their entirety.

This embodiment also allows the formation of layers 22 and 24 over one type of substrate, for example a substrate which is better suited for layer formation or is less fragile, but transfers the pattern to another template having different characteristics such as improved transparency, for example for the passage of UV light for curing a coating.

Figure 13:
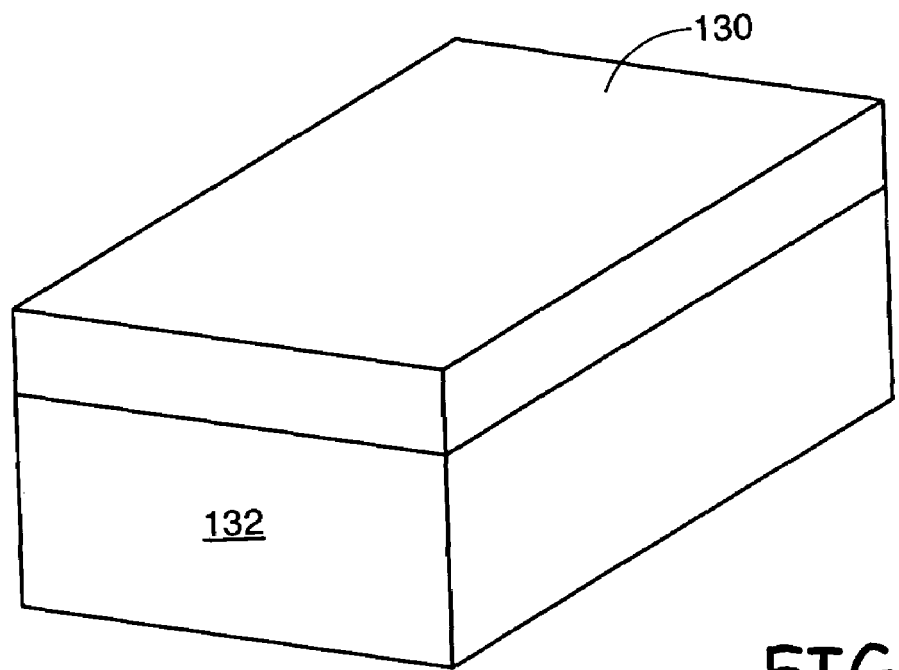
FIGS. 13-21 are isometric depictions of intermediate structures formed during another embodiment to form a nanoimprint lithography template.
Figure 14:
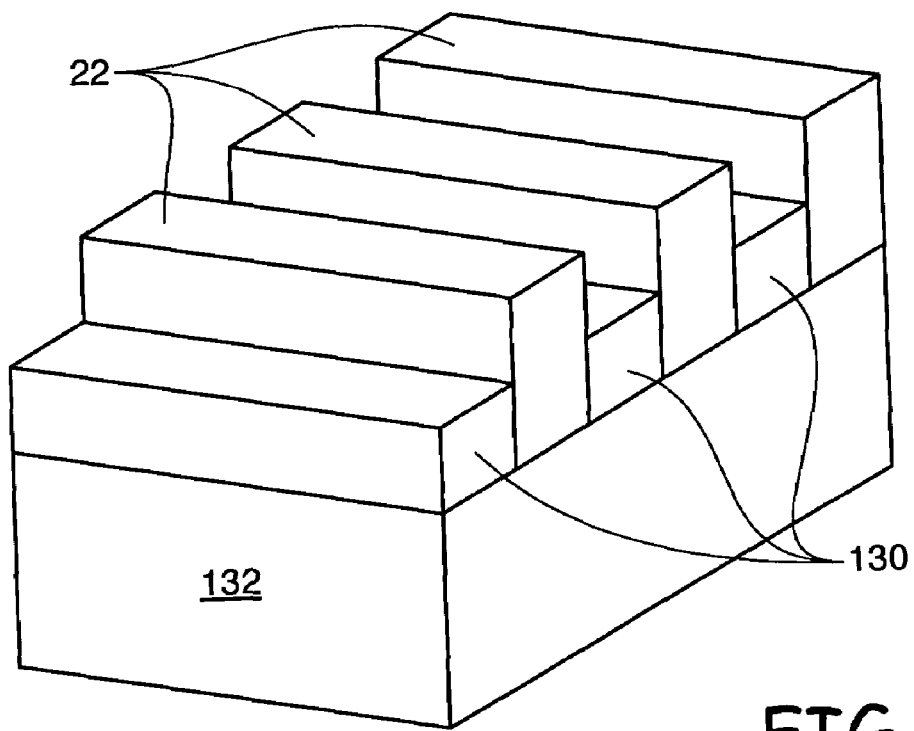

A process for forming a second template using a first template, for example to provide a template used to form a plurality of nanodots over the surface of a semiconductor wafer substrate assembly, is depicted in FIGS. 13-27. In FIG. 13, a mask material such as a low-viscosity monomer, a photoresist layer, or a polymer is formed over a template substrate 132 such as doped or undoped silicon, quartz, germanium, etc. The mask layer 130 may be between about 20 Å thick to about 1,000 Å thick, while the template substrate 132 may be between about 10 µm thick to about 1,000 µm thick. Prior to curing the mask layer, a template formed in accordance with FIG. 5, for example, having blades 22, is placed into the mask material and may contact the substrate 132 as depicted in FIG. 14. For simplicity of illustration, FIG. 14 only depicts the blades 22 themselves, not the substrate 10 (FIG. 5) on which the blades 22 are formed. After placing blades 22 into the mask material 130, the mask material is cured by a suitable technique, which depends on the nature of the mask material, and the blades 22 are removed from the mask material to result in the structure of FIG. 15.

Figure 15:
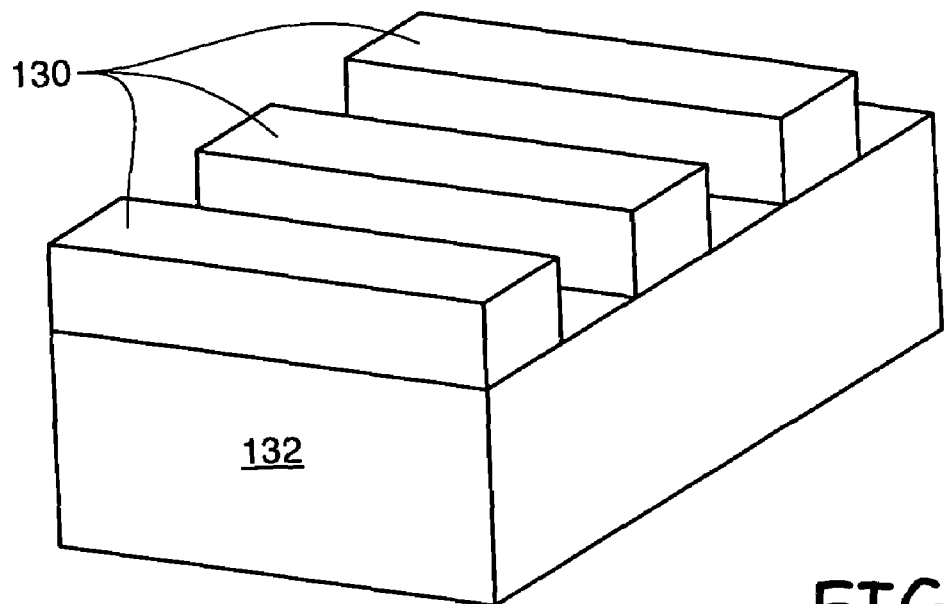
Figure 16:
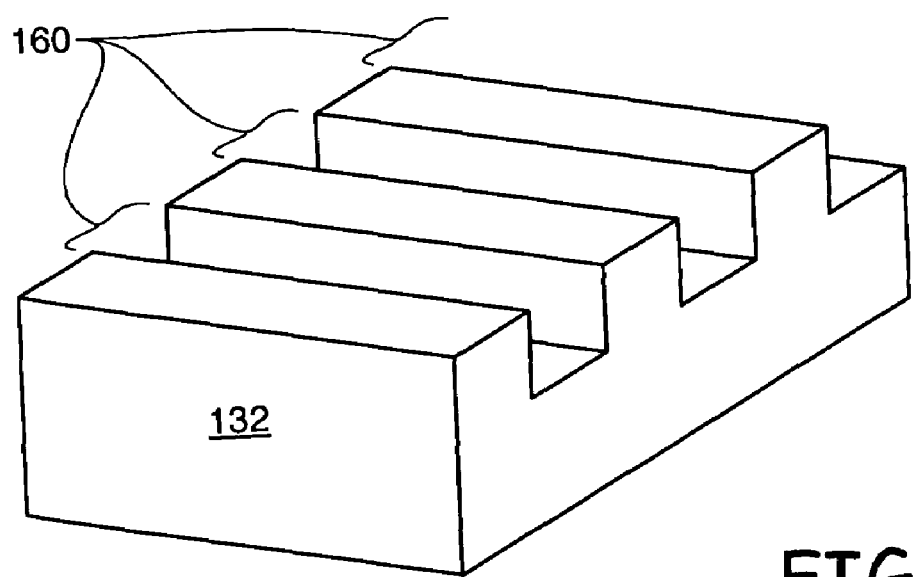
Figure 17:
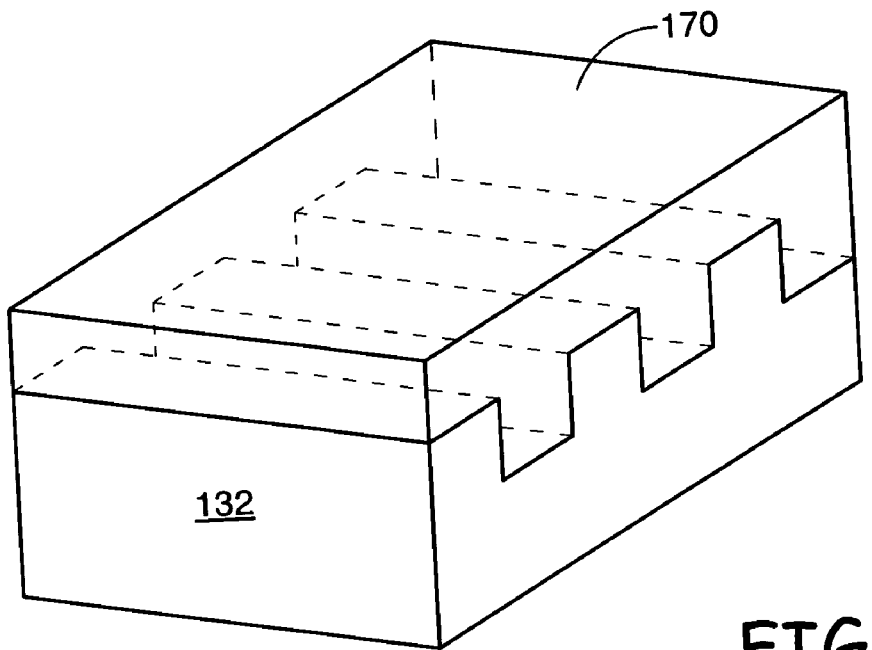
Figure 18:
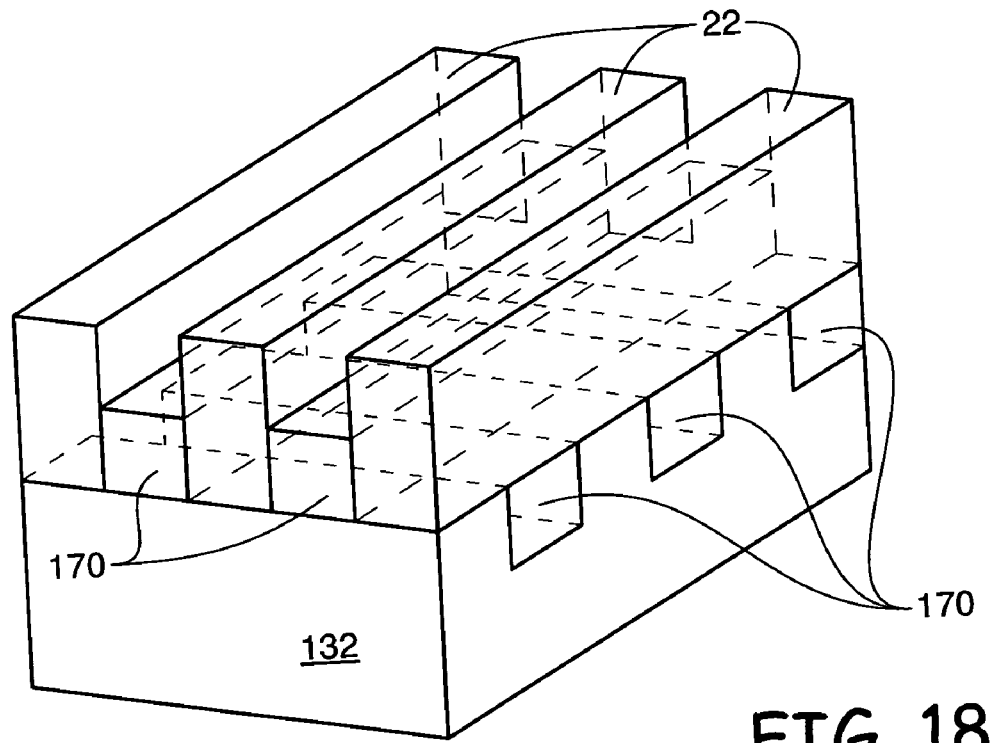
Figure 19:
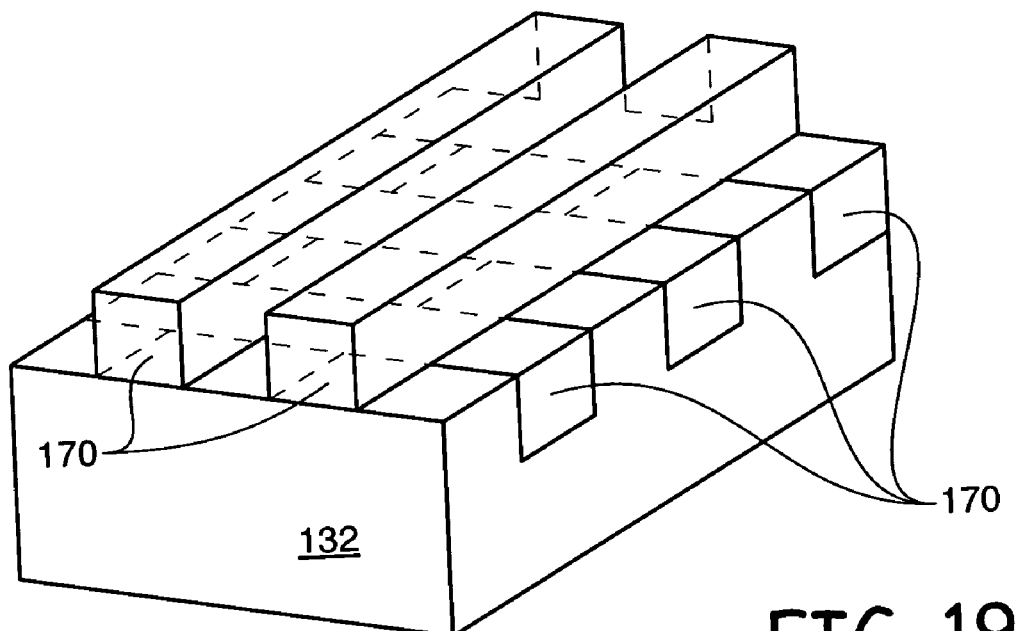

Subsequent to forming the FIG. 15 structure, the substrate 132 is partially etched, for example using an anisotropic plasma etch, then the mask layer 130 is removed to result in the FIG. 16 structure having a plurality of parallel grooves 160 in the substrate 132. Next, another mask layer 170 is formed over the FIG. 16 substrate 132 to result in the structure of FIG. 17. The blades 22, which may be the same blades used in the FIG. 14 depiction or blades having different dimensions, are placed in the mask material 17 perpendicular to the direction of the grooves 160 as depicted in FIG. 18 then the mask material 170 is cured. After curing mask 170 the blades 22 are removed to result in the FIG. 19 structure. Another anisotropic etch of the substrate 132 is performed which results in the structure of FIG. 20.

Figure 20:
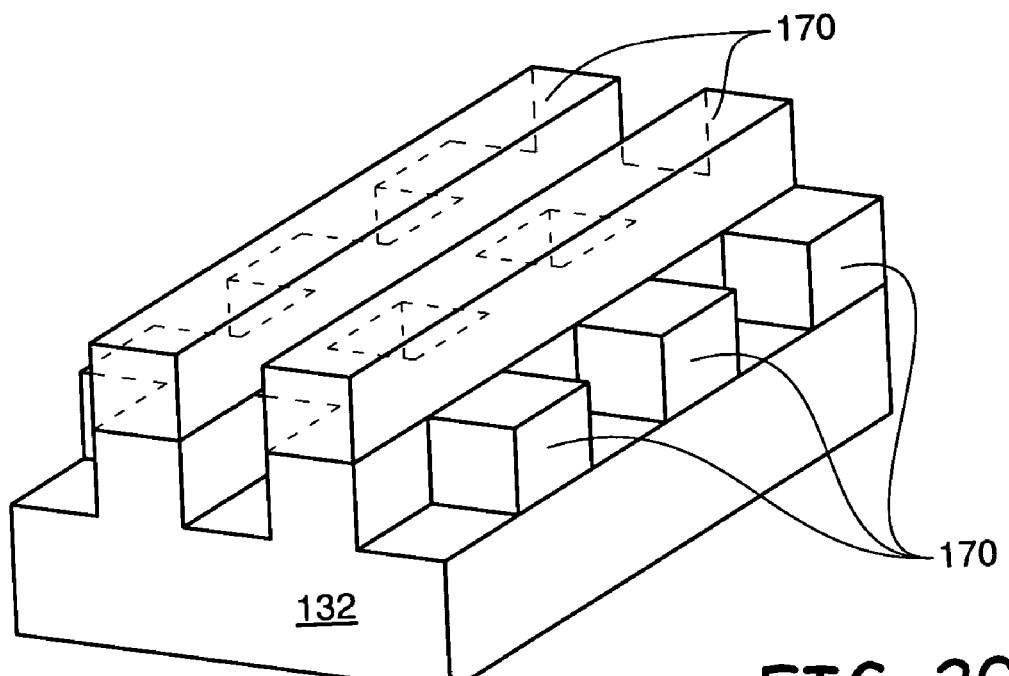
Figure 21:
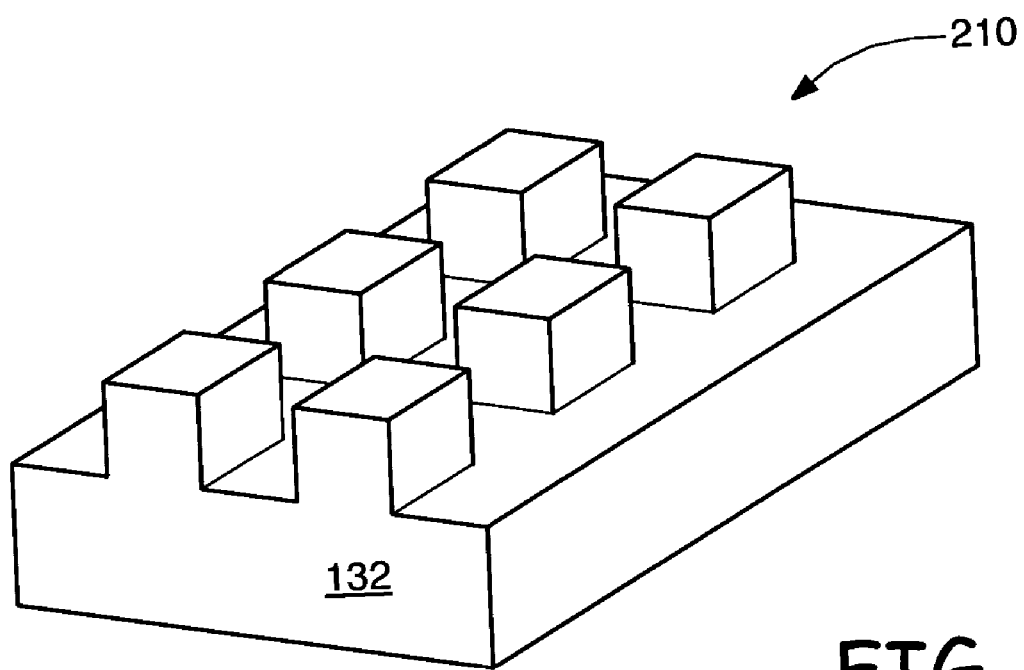

After forming the FIG. 20 structure the mask layer 170 is removed to result in structure 210 of FIG. 21, which is the completed second template which, in this embodiment, are most effectively used as a template for nanodots as described below. However, in an alternate embodiment, the substrate is coated with thin, conformal metal layer such as titanium nitride and the final structure 210 with the metal coating would form the nanodots. This method, however, may be more difficult and time consuming than the process discussed below, and thus it is contemplated that structure 210 is more effectively used as a template to maximize production throughput. One difference between using the metal coated structure 210 as the nanodots themselves and using structure 210 as a template for the nanodots is that the nanodots are raised over the surface using the former process, and are formed within an overlying surface in the latter process, which is discussed below.

Figure 22:
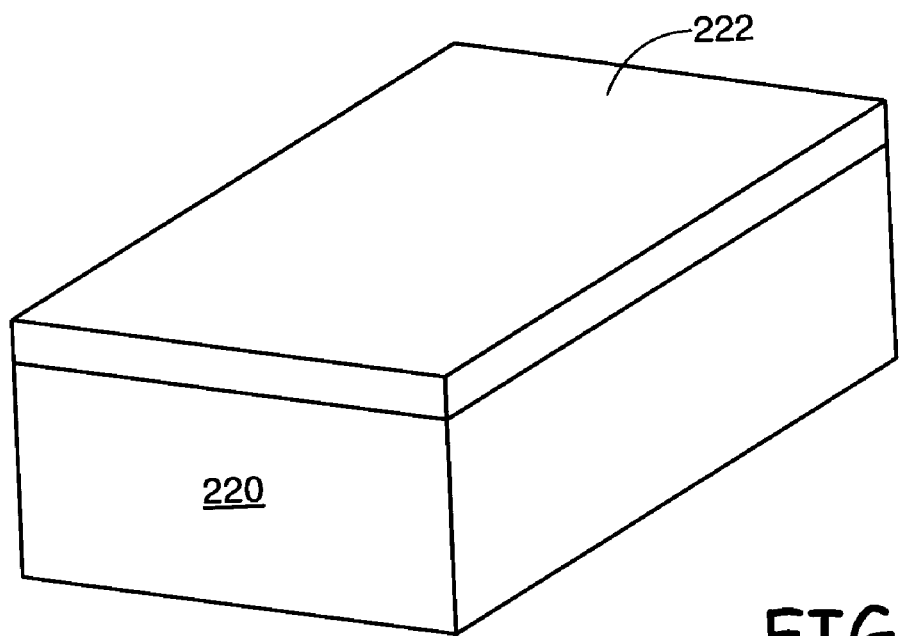
FIGS. 22-27 are isometric depictions of a method for forming a plurality of features such as nanodots using the template formed in accordance with the embodiment of FIGS. 13-21.

To form a device using template 210, a semiconductor wafer substrate assembly 220 is provided as depicted in FIG. 22, which will typically comprise a number of individual features (not individually depicted) formed thereover as is known in the art of semiconductor manufacture. These features may comprise doped regions within a semiconductor wafer and transistors such as floating gate transistors, or various in-process (i.e. incomplete) semiconductor features, formed over the wafer. A mask layer 222, such as a polymer, a low-viscosity monomer, or a photoresist layer is formed over the substrate assembly 220. Subsequently, the template 210 is placed into the mask layer 222, then the mask layer 222 is cured and the template 210 is removed to result in the structure of FIG. 23 wherein the pattern on template 210 is transferred into the mask layer 222.

Figure 23:
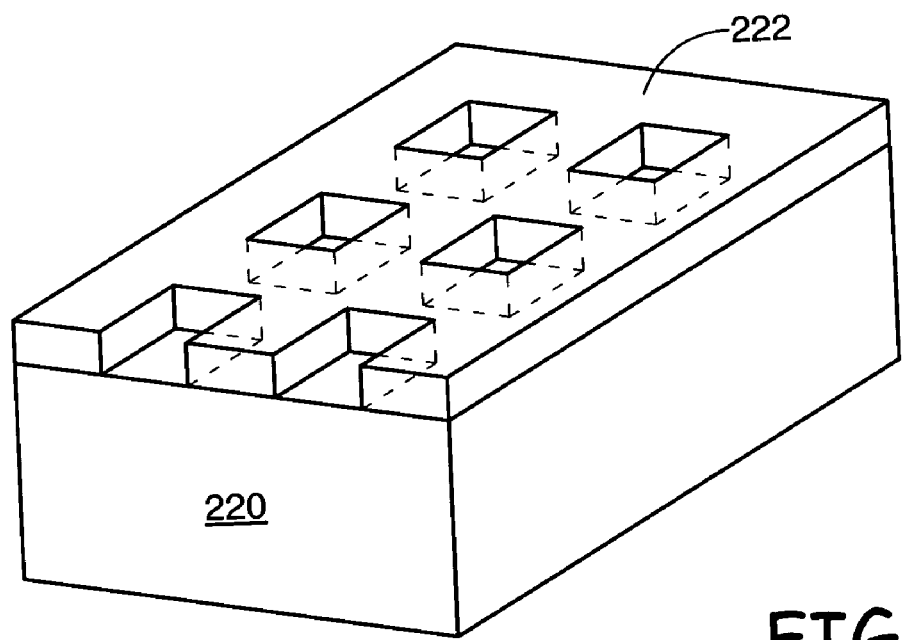
Figure 24:
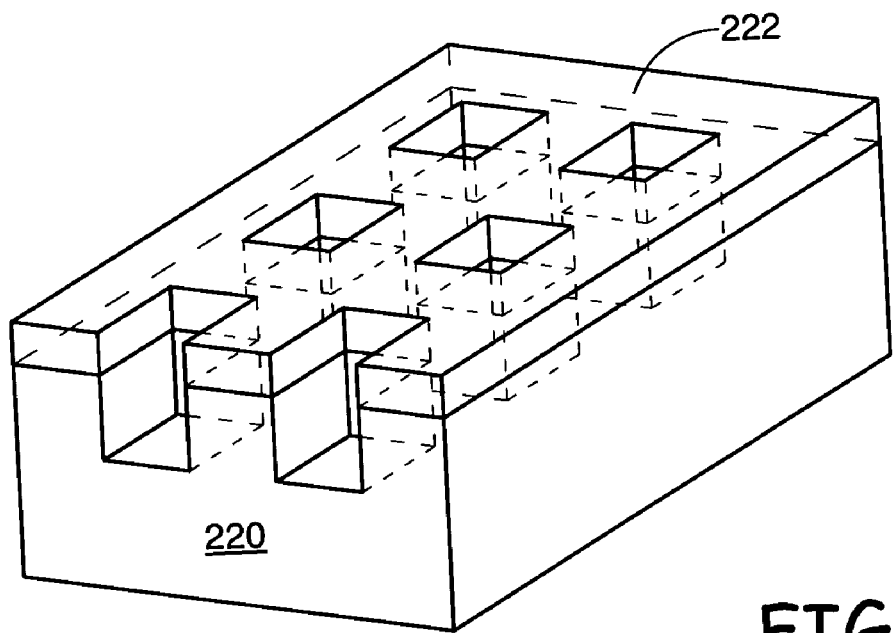
Figure 25:
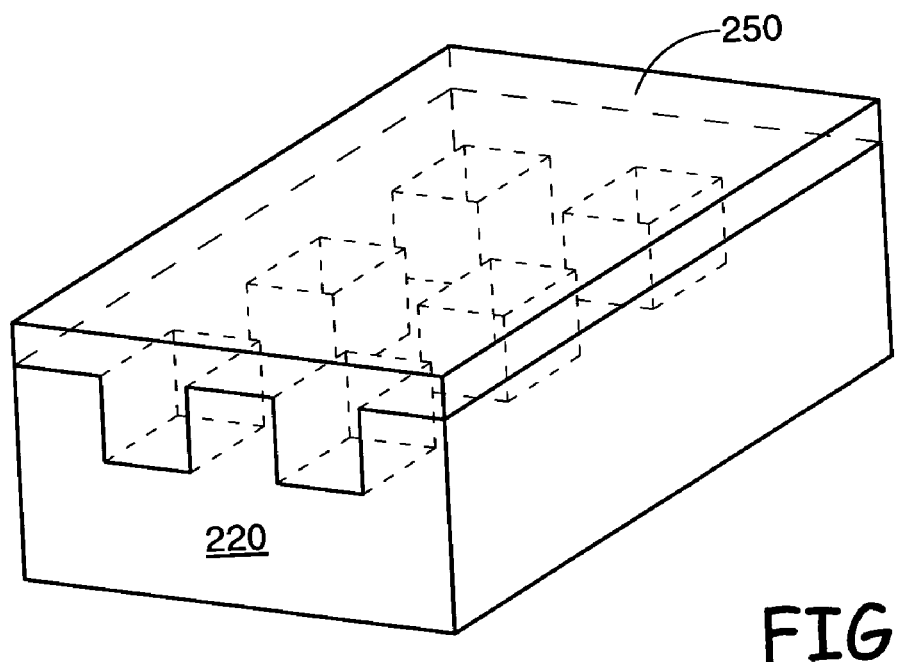
Figure 26:
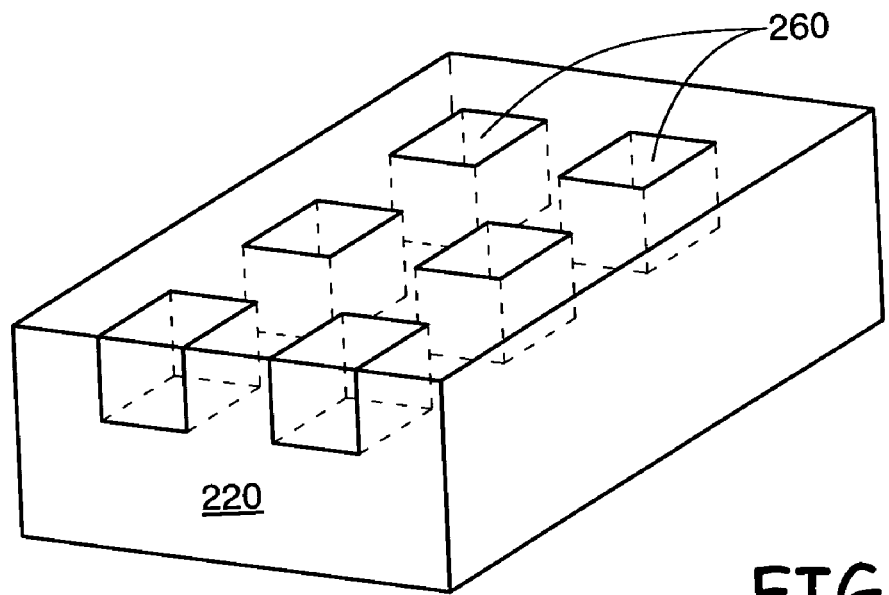
Figure 27:
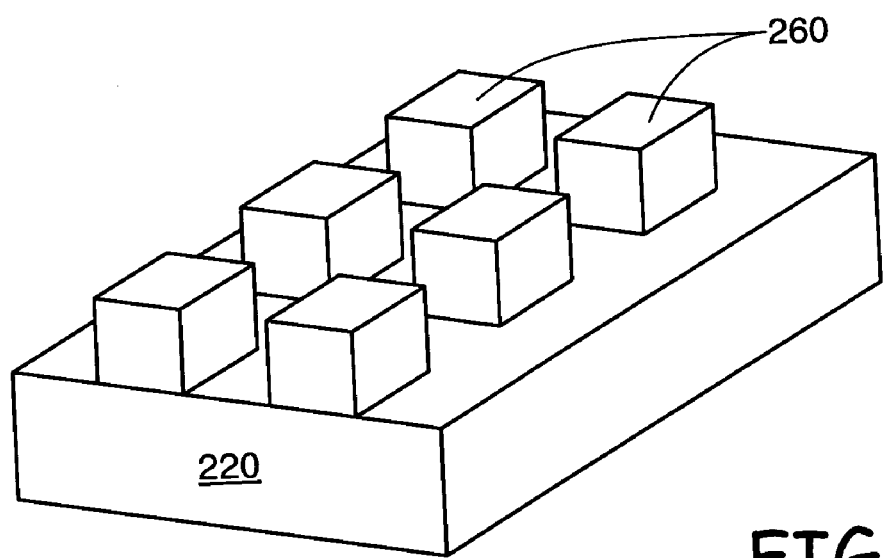

After forming the FIG. 23 structure, the substrate assembly 220 is anisotropically etched using the patterned mask layer 222 as a pattern to result in the structure of FIG. 24. Next, the mask layer 222 is removed and a blanket layer such as a metal layer 250 is formed over the surface of the substrate assembly as depicted in FIG. 25. The metal layer 250 is planarized in a damascene process to remove the upper surface and to result in the structure of FIG. 26 having individual structures formed from layer 250. Finally, the substrate assembly 220 is etched selective to features 250 to result in the structure of FIG. 27 having nanodots 260. These nanodots may have a dimension of between about 1 nanometer (nm) and about 10 nm on each side, and a height of between about 1 nm and about 10 nm.

Figure 28:
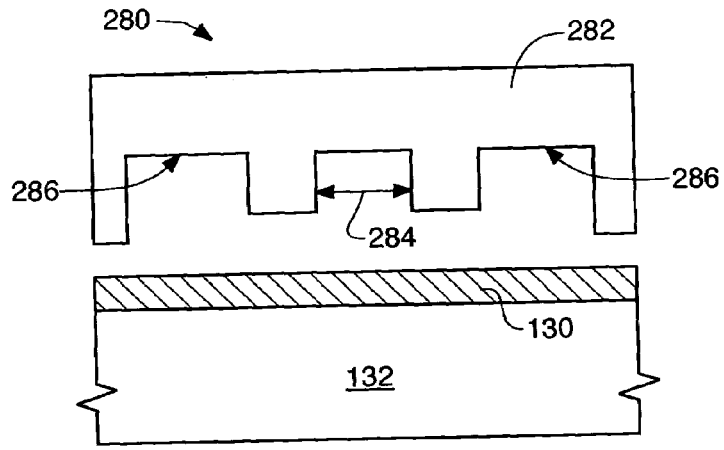
FIGS. 28-36 are cross sections depicting the formation of a structure with a nanoimprint lithography template formed in accordance with an embodiment of the invention.

Another embodiment for forming a pattern in a mask layer is depicted in FIGS. 28-36. In this embodiment, a substrate 132 and an uncured mask layer 130 are provided. The mask layer of this embodiment comprises a material which has a low viscosity and is readily flowable. FIG. 28 further depicts a template 280 comprising a substrate 282 and a pattern 284 formed in accordance with previously described methods. The pattern 284 may comprise blades 170 depicted in FIG. 20, or the rectangular pattern as depicted in FIG. 21. For this embodiment, the pattern may be etched deeper into the substrate (for the template embodiment of FIG. 21) or may be formed to have the longer blades of FIG. 5 rather than the shorter blades of FIG. 6 to reduce adhesion of the mask material 130 to the horizontal substrate surface 286. Pattern elements should be spaced sufficiently to reduce problems resulting from capillarity. Spacers 288 are provided which will accurately control the separation between the template and the substrate. These spacers 288 can be placed at various locations around the wafer surface, and may comprise elongated walls or isolated pillars. The spacers may be formed such that they are more substantial than the blades for physical stability during contact with the substrate, and reduce damage to the blades which might occur from unintentional contact between the blades and the substrate.

Figure 29:
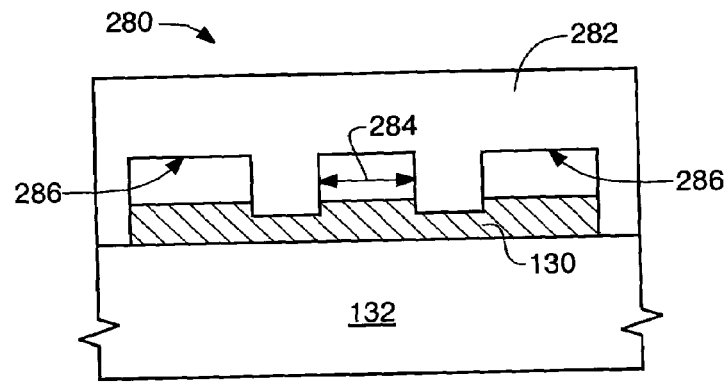
Figure 30:
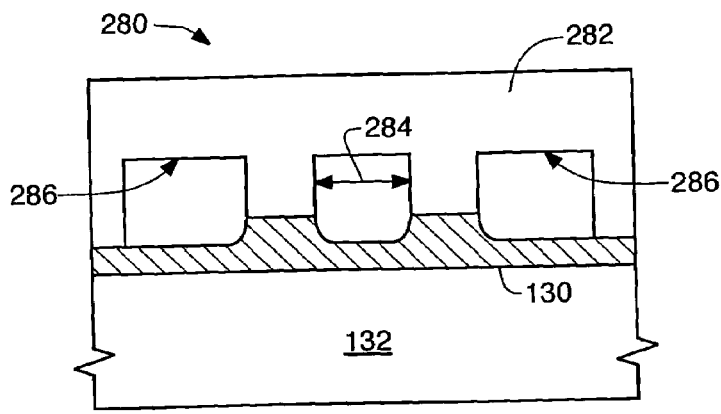
Figure 31:
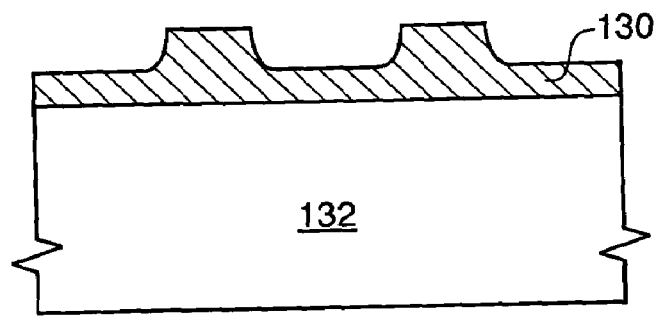
Figure 32:
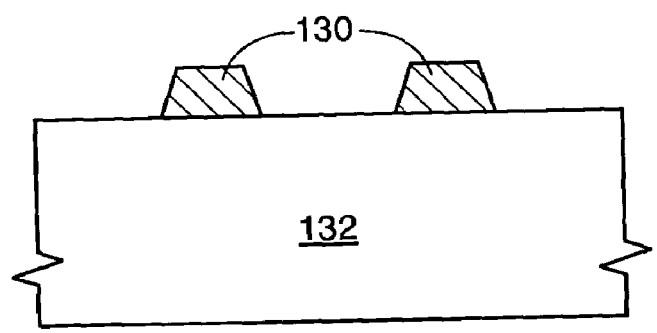
Figure 33:
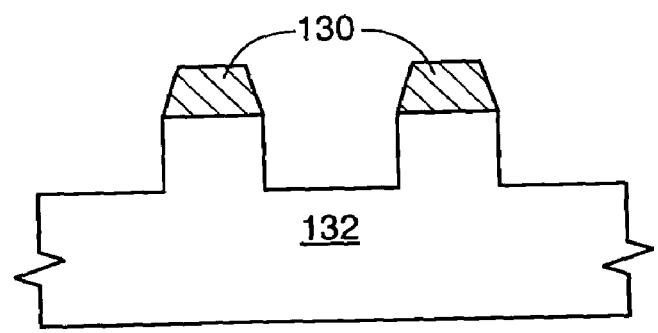
Figure 34:
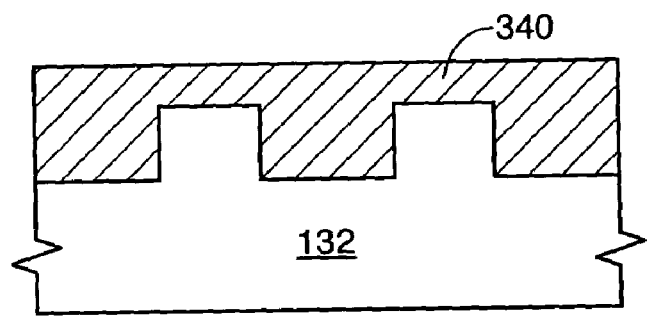

After providing the template 280, the substrate assembly 132, and the uncured mask layer 130, the pattern 284 of the template 280 is lowered into the uncured mask layer as depicted in FIG. 29, and stop when spacers 288 contact the surface of assembly 132. The template 280 is then urged away from the substrate assembly 132 as depicted in FIG. 30. The mask material 130 is cured and the template 280 is removed to result in the structure of FIG. 31. An isotropic or anisotropic etch is performed on the mask layer 130 of the FIG. 31 structure to result in FIG. 32 having discrete mask portions 130. An anisotropic etch is performed on the substrate assembly 132 which is selective to the mask 130, to result in the structure of FIG. 33, then the mask layer 130 is removed.

Figure 35:
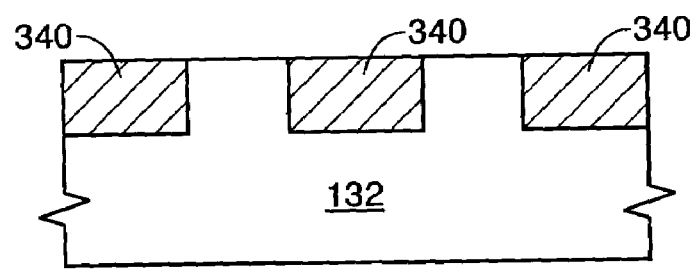
Figure 36:
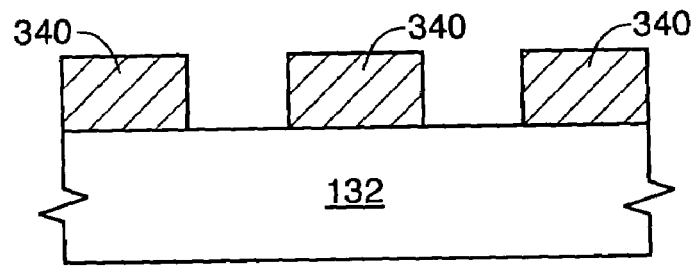

Next, a blanket layer 340 such as a metal layer is formed over the substrate assembly 132, and then the blanket layer is planarized, for example using a mechanical planarization such as chemical mechanical planarization to result in the structure of FIG. 35. Finally an isotropic or an anisotropic etch is performed on the substrate assembly 132 which is selective to the material of layer 340 to result in the structure of FIG. 36.

In contrast to the embodiments of FIGS. 7-9 and 13-27 which forms a negative mask of the template pattern, the embodiment of FIGS. 28-36 results in a positive mask of the template pattern.

Figure 37:
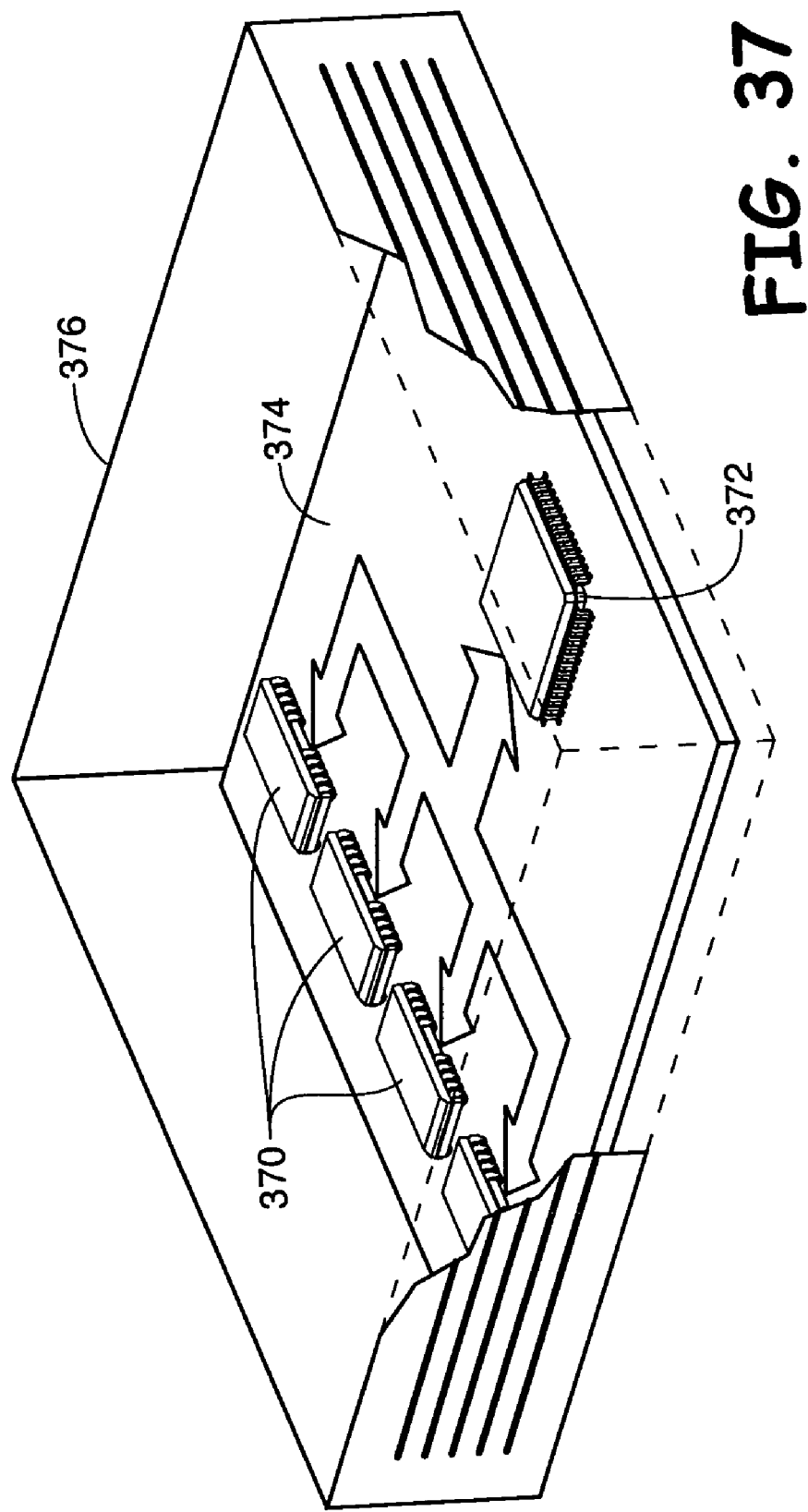
FIG. 37 is an isometric depiction of various components that may be manufactured using devices formed with an embodiment of the present invention.

As depicted in FIG. 37, a semiconductor device 370 formed using a nanoimprint template in accordance with the invention may be attached along with other devices such as a microprocessor 372 to a printed circuit board 374, for example to a computer motherboard or as a part of a memory module used in a personal computer, a minicomputer, or a mainframe 376. FIG. 37 may also represent use of device 370 in other electronic devices comprising a housing 376, for example devices comprising a microprocessor 372, related to telecommunications, the automobile industry, semiconductor test and manufacturing equipment, consumer electronics, or virtually any piece of consumer or industrial electronic equipment.

Figure 38:
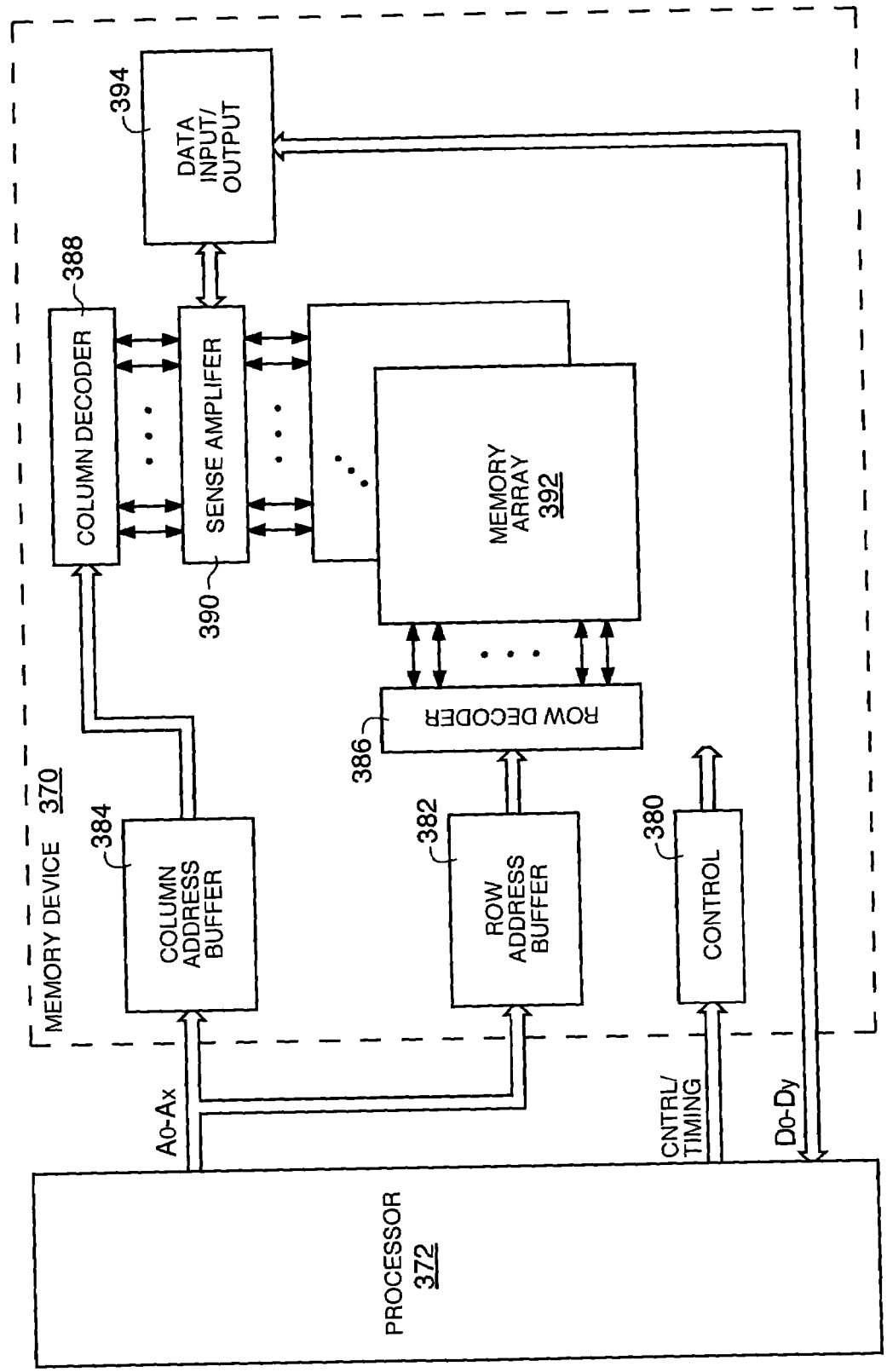
FIG. 38 is a block diagram of an exemplary use of the invention to form part of a memory device having a storage transistor array.

A nanoimprint lithography template formed using a method described herein may be used to manufacture a number of different structures. FIG. 38, for example, is a simplified block diagram of a memory device such as a dynamic random access memory having patterned features formed using a nanoimprint template formed using an embodiment of the present invention. The general operation of such a device is known to one skilled in the art. FIG. 38 depicts a processor 372 coupled to a memory device 370, and further depicts the following basic sections of a memory integrated circuit: control circuitry 380; row 382 and column 384 address buffers; row 386 and column 388 decoders; sense amplifiers 390; memory array 392; and data input/output 394.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method for forming a nanoimprint lithography template, comprising:

providing a template base having a major surface;

forming at least one cross sectional pillar on the major surface of the template base;

forming a blanket pattern layer over the major surface and over the at least one cross sectional pillar;

forming a blanket spacing layer on the blanket pattern layer;

forming a filler layer over the blanket pattern layer and over the blanket spacing layer;

planarizing the filler layer, the blanket spacing layer, and the pattern layer to expose the at least one pillar;

etching the spacing layer to cause protrusion of a portion of the pattern layer from the spacing layer; and etching the pillar and the filler layer during the etching of the spacing layer.

2. The method of claim 1 further comprising:

repeating the formation of the blanket pattern layer and the blanket spacing layer to form a plurality of alternating pattern layers and spacing layers; and wherein etching the spacing layer comprises etching the plurality of spacing layers to cause protrusion of a portion of each of the plurality of pattern layers from the plurality of spacing layers.

3. The method of claim 1 further comprising using chemical mechanical planarization to planarize the filler layer, the blanket spacing layer, and the pattern layer.

4. The method of claim 1 wherein the at least one pillar, the spacing layer, and the filler layer each comprise at least one of silicon dioxide and silicon nitride and the pattern layer comprises at least one of metal and polysilicon.

5. A method for forming a nanoimprint lithography template, comprising:

providing a template base having a major surface, wherein the template base is a sacrificial first template base;

forming at least one cross sectional pillar on the major surface of the sacrificial first template base;

forming a blanket pattern layer over the major surface and over the at least one cross sectional pillar;

forming a blanket spacing layer on the blanket pattern layer;

forming a filler layer over the blanket pattern layer and over the blanket spacing layer;

planarizing the filler layer, the blanket spacing layer, and the pattern layer to expose the at least one pillar;

providing a second template base;

subsequent to exposing the at least one pillar, adhering the pattern layer to the second template base;

removing the sacrificial first template base; and then etching the spacing layer to cause protrusion of a portion of the pattern layer from the spacing layer.

6. The method of claim 5 further comprising adhering the pattern layer to the second template base with a material selected from the group consisting of a eutectic alloy, a glass grit, and a photoresist.

* * * * *

UNITED STATES PATENT AND TRADEMARK OFFICE
CERTIFICATE OF CORRECTION

PATENT NO. : 7,662,299 B2  Page 1 of 1
APPLICATION NO. : 11/214684
DATED : February 16, 2010
INVENTOR(S) : Subramanian et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1205 days.

Signed and Sealed this

Thirtieth Day of November, 2010

David J. Kappos
*Director of the United States Patent and Trademark Office*